United States Patent [19]

Toshima et al.

[11] Patent Number: 5,633,040

[45] Date of Patent: May 27, 1997

[54] METHOD AND APPARATUS FOR TREATING FILM COATED ON SUBSTRATE

[75] Inventors: Takayuki Toshima, Nirasaki; Tohru Aoyama, Yamanashi-ken, both of Japan

[73] Assignee: Tokyo Electron Limited, Tokyo, Japan

[21] Appl. No.: 246,817

[22] Filed: May 20, 1994

[30] Foreign Application Priority Data

May 20, 1993 [JP] Japan .................................. 5-118089

[51] Int. Cl.$^6$ .......................... B05D 3/02; B05D 3/12
[52] U.S. Cl. .............. 427/335; 427/370; 427/372.2; 427/377; 427/384; 430/330
[58] Field of Search ....................... 427/335, 372.2, 427/374.2, 370, 377, 240, 384; 437/231; 430/327, 330

[56] References Cited

U.S. PATENT DOCUMENTS 4,794,021  12/1988  Potter ...................... 430/330
5,177,514   1/1993  Ushijima et al. .

*Primary Examiner*—Thorl Chea
*Attorney, Agent, or Firm*—Oblon, Spivak, McClelland, Maier & Neustadt, P.C.

[57] ABSTRACT

A film treating method treats a resist film which is formed on a substrate by spin coating. The method comprises a step for coating resist on the substrate to form the resist film, a step for conveying the substrate to a region having an atmosphere of a saturated vapor or a super-saturated vapor of solvent before the solvent contained in the resist film is lost, a step for executing a first heating process wherein the substrate is heated at a temperature which lowers the viscosity of the resist film and permits solvent to remain in the resist film in an amount sufficient to maintain the fluidity of the resist film, a step for conveying the substrate away from the region having the atmosphere of the saturated vapor or the super-saturated vapor of solvent, and a step for executing a second heating process wherein the substrate is heated at a temperature higher than that of the first heating process, thereby permitting the solvent to evaporate from the resist film.

13 Claims, 4 Drawing Sheets

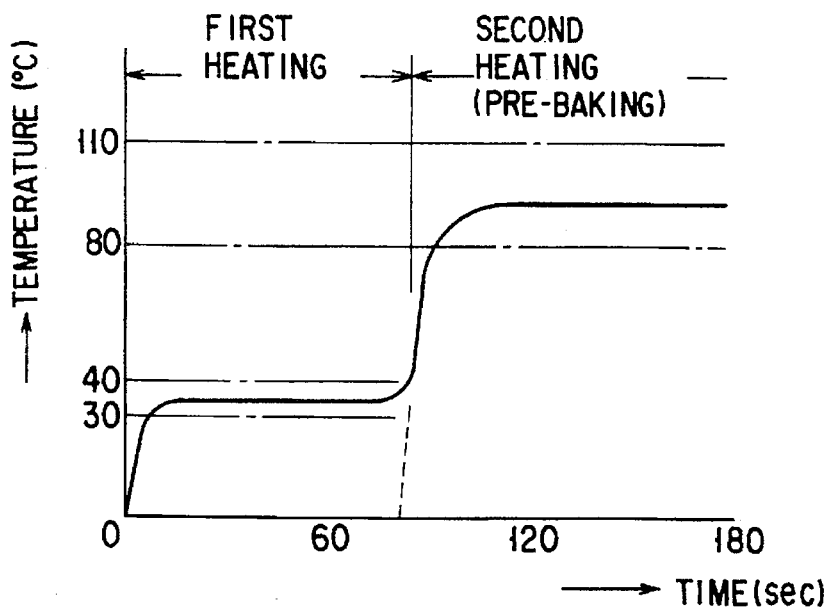
F I G. 4
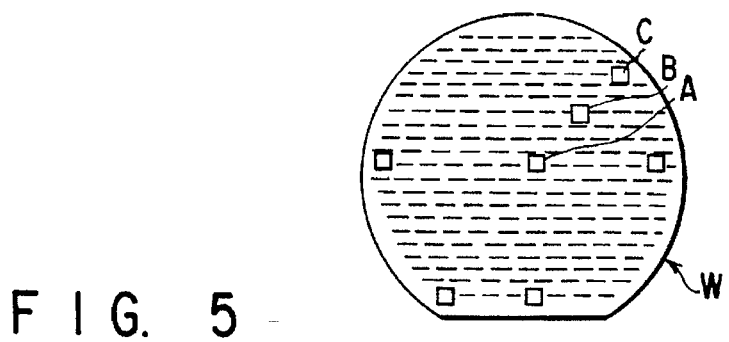
F I G. 5
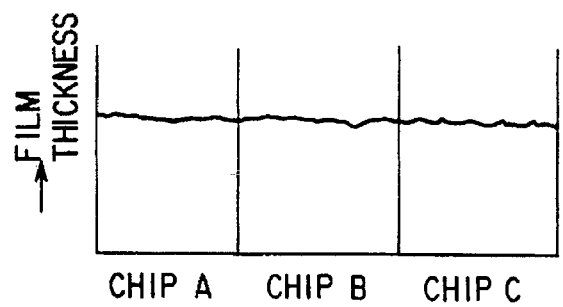
F I G. 7

METHOD AND APPARATUS FOR TREATING FILM COATED ON SUBSTRATE

BACKGROUND OF THE INVENTION

1. Field of the Invention

The present invention relates to a film treatment method and apparatus, used in the manufacturing process of semiconductor elements or LCD substrates, for heating and drying a resist film or another kind of film coated on the surface of a wafer, an LCD glass plate or the like.

2. Description of the Related Art

In the manufacturing process of semiconductor devices, a circuit pattern is transferred onto a resist film on a semiconductor wafer and developed by photolithography. The resist treatment technique used in the photolithography step is important so as to ensure satisfactory functions and characteristics of a stepper (a mask aligner) and to make the most of the characteristics of dry etching subsequently performed.

A resist solution is a solution obtained by adding a solvent to a high molecular material (photosensitive resin). A resist film is formed by uniformly coating the resist solution over the surface of a semiconductor wafer.

In many cases, a spin coating method is used in the resist coating step. In the spin coating method, a resist solution is made to drop onto the center of the upper surface of a wafer, and then the wafer is rotated by means of a spinner. The resist solution is uniformly spread on the entire surface of the wafer by a centrifugal force, thereby forming a resist film on the entire surface of the wafer. In the spin coating step, the resist film is dried by the wind caused by both the rotation of the wafer and the exhaustion of splashing resist, to such an extent that the resist film loses its fluidity.

After the resist coating step, the wafer is pre-baked at a temperature of 80° to 110° C. for several seconds by means of a baking apparatus (a heat treatment apparatus), so as to further dry the resist film. As baking apparatuses, many types are known, such as a hot plate type, an oven type, an infrared heating type, etc. Each of these known baking apparatuses comprises exhausting means, and this exhausting means forcibly exhausts the processing chamber of the gaseous solvent which evaporates from the resist film at the time of pre-baking.

After the pre-baking step, the resist film is exposed to light for development, subjected to post baking (hard baking) and etching, and removed in the final step.

If a wafer subjected to spin coating has a number of chips on which circuit patterns are formed at different levels, a resist solution cannot be uniformly spread on the entire surface of the wafer. That is, the resist film formed on the wafer is not uniform in thickness.

The reason for this is that the surface of the wafer to be coated with the resist solution is uneven. When the resist solution is spread on the wafer, the centrifugal force causes the resist solution on each chip to flow from the center of rotation of the wafer in both the radially outward direction and in the direction opposite to the rotating direction. It should be noted that the wafer moves faster at the radially-outer portions (peripheral portions) than at the radially-inner portions (central portions). Hence, the resist solution present on the radially-outer portions of the wafer is exposed to stronger wind than the resist solution present on the radially-inner portions, and is therefore dried quickly. Further, an undried resist solution flows from the radially-inner portions of the wafer onto the dried resist solution present on the radially-outer portions.

As can be seen from the above, when resist is coated on a wafer on which a pattern is formed, the resist film formed thereby has internal stress and has different thicknesses, depending upon the radial positions of the wafer, as is shown in FIG. 6. In addition, the thickness difference of the resist film is greater in the chips B and C located in the peripheral portion of the wafer than in the chip A located in the central portion thereof. This thickness difference becomes greater in accordance with an increase in the diameter of the wafer. For example, the thickness difference is greater in an 8-inch wafer than in a 6-inch wafer.

If a wafer coated with a resist film of nonuniform thickness is heated at a high temperature (e.g., 100° C. or thereabouts) in the subsequent pre-baking step, the resist film is dried and hardened in the state where the internal stress mentioned above remains (i.e., the state where the resist film has different thicknesses). This results in an obstacle both to the satisfactory functions and characteristics of the stepper and to the satisfactory characteristics of dry etching subsequently performed.

SUMMARY OF THE INVENTION

Accordingly, an object of the present invention is to a film treating method and apparatus which can easily reduce the stress of a film formed on a wafer by spin coating and which enable a film of uniform thickness to be formed even on a large-diameter substrate having an uneven surface.

To attain this object, the present invention provides a film treating method which treats a resist film formed on a substrate by spin coating and which comprises:

a step for coating resist on the substrate to form the resist film;

a step for conveying the substrate to a region having an atmosphere of a saturated vapor or a super-saturated vapor of solvent before the solvent contained in the resist film is lost, a step for executing a first heating process wherein the substrate is heated at a temperature which lowers the viscosity of the resist film and permits solvent to remain in the resist film in an amount sufficient to maintain the fluidity of the resist film;

a step for conveying the substrate from the region having the atmosphere of the saturated vapor or the super-saturated vapor of solvent; and a step for executing a second heating process wherein the substrate is heated at a temperature higher than that of the first heating process, thereby permitting the solvent to evaporate from the resist film.

According to the film treating method of the present invention, the resist film coated on a substrate is heated in the first heating process such that the viscosity of the resist film is lowered and the evaporation of the solvent is suppressed. Since the fluidity of the resist film is therefore maintained in the first heating process, the internal stress which is generated in the resist film due to spin coating is reduced, thereby decreasing a local thickness difference of the resist film.

In the first heating process, it is desirable that the substrate be overlaid with a cover for defining a small-volume space and heated at a low temperature, so as to suppress evaporation of the solvent from the resist film.

A film treating apparatus provided by the present invention comprises:

a chamber;

means for conveying a substrate into the chamber before solvent contained in a film coated on the substrate is lost;

a mount table for supporting the substrate in the chamber in a substantially horizontal state;

a cover with which the substrate is overlaid so as to create an atmosphere of a saturated vapor or a super-saturated vapor of solvent in a region surrounding the substrate; and means for heating the substrate at a temperature which lowers the viscosity of the film and permits solvent to remain in the film in an amount sufficient to maintain the fluidity of the film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a graph showing how the temperature changes in first and second heat treatments;

FIG. 5 is a schematic plan view showing a semiconductor wafer on which a pattern is formed;

FIG. 7 is a graph showing the thickness variations of a resist film formed in the film treatment method of the present invention;

DETAILED DESCRIPTION OF THE PREFERRED EMBODIMENTS

Embodiments of the present invention will now be described with reference to the accompanying drawings.

Figure 1:
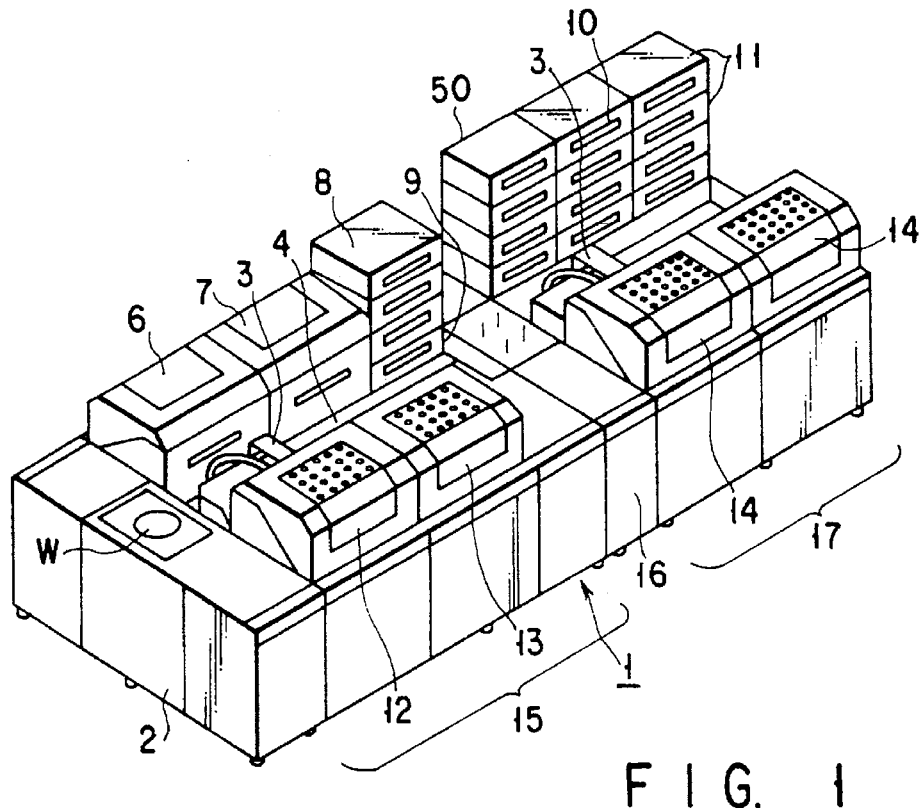
FIG. 1 is a perspective view showing a resist treatment system used in the manufacturing process of semiconductor wafers.

As is shown in FIG. 1, a loader section 2 (i.e., a cassette station) is provided at one end of a resist treatment system 1, and a cassette containing a large number of semiconductor wafers W is conveyed from the loader section 2 into the resist treatment system 1. A first process section 15 comprising a plurality of process chambers 6, 7, 8, 9, 12 and 13 is coupled to the loader section 2. A second process section 17 is coupled at one end to the first process section 15, with an interface section 16 interposed therebetween. The second process section 17 comprises a plurality of chambers 10, 11, 13 and 14. Conveyance paths 4 are defined in the centers of the first and second process sections 15 and 17, and arm mechanisms 3 are movable along the respective conveyance paths 4. Each arm mechanism 3 takes out wafers W from the cassette one by one, and conveys them to the process chambers 6–14. An exposure device (not shown) is coupled to the other end of the second process chamber 17.

The process chambers are arranged on two sides of the conveyance paths 4. The process chambers located on one side of the conveyance path 4 of the first process section 15 are a brush cleaning chamber 6, a jet cleaning chamber 7, an adhesion chamber 8, and a cleaning chamber 9. The process chambers located on one side of the conveyance path 4 of the second process chamber 17 are a film treatment chamber 50, another film treatment chamber 10, and a pre-baking chamber 11.

The process chambers located on the other side of the conveyance path 4 of the first process section 15 are a resist coating chamber 12 and a resist removing chamber 13. A spin coater (not shown) is located inside the resist coating chamber 12. Two development chambers 14 are located on the other side of the conveyance path 4 of the second process chamber 17.

Figure 2:
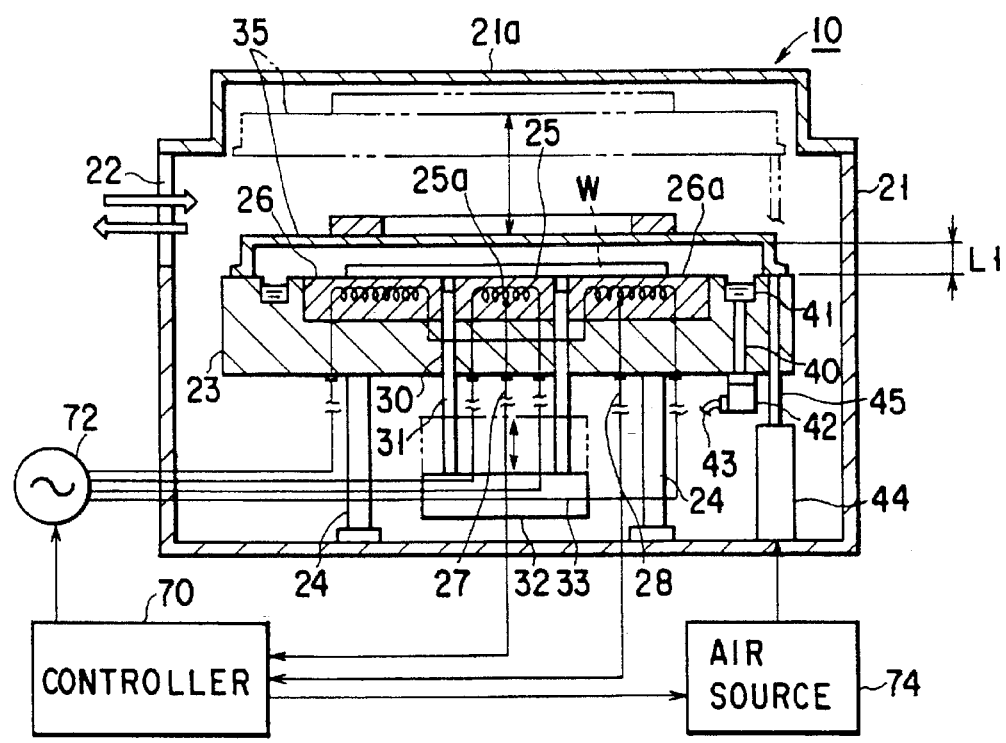
FIG. 2 is a sectional view showing a film treatment apparatus according to the first embodiment of the present invention.

The film treatment apparatus 10 will now be described with reference to FIG. 2.

The film treatment apparatus 10 comprises a box-like frame 21 having a cover 21a. An insertion/takeout port 22 is located at one side the frame 21. Through this insertion/takeout port 22, resist-coated wafers W are inserted or taken out from the apparatus 10 by means of the arm mechanism 10. A mount table 23 is arranged in the center of the internal region of the frame 21 and fixed to the frame 21 by means of a number of legs 24.

Inner and outer hot plates 25 and 26 are arranged on top of the mount table 23 such that they are coaxial with each other. Planar heater elements 25a and 26a are embedded in the inner and outer hot plates 25 and 26, respectively. Each of the heater elements 25a and 26a is connected to a power supply 72, which in turn is connected to the output terminal of a controller 70. A temperature sensor 27 is provided for the inner hot plate 25; likewise, a temperature sensor 28 is provided for the outer hot plate 26. These temperature sensors 27 and 28 are connected to the input terminals of the controller 70.

The controller 70 incorporates a CPU and a memory, and controls the power supply 72 in response to temperature detection signals supplied thereto such that the wafers W are heated to a temperature within the range of 30° to 60° C. The power supply 72 comprises a circuit which enables power to be supplied to the inner and outer hot plates 25 and 26 independently of each other. Since a resist film formed by spin coating has greater stress in the peripheral portions of a wafer W than in the central portions thereof, it is preferable that the temperature of the outer hot plate 26 be higher than that of the inner hot plate 25.

Three through-holes 30 are formed the mount table 23, and a support pin 31 is inserted into each of the through-holes 30. The lower end of each support pin 31 is fixed to the lifting arm 33 of a first lifting mechanism 32. The first lifting mechanism 32 comprises a motor, a ball screw and a cylinder which are located at the rear of the frame 21. A wafer W is separated from the mount table 23 by protruding the three support pins 31 from the mount table 23.

A sealing cover 35 is located above the mount table 23. The rod 45 of a cylinder 44 (i.e., a second lifting mechanism) 44 is coupled to the sealing cover 35. The cylinder 44 is connected to an air source 74 through a pipe circuit. When the rod 45 is projected from the cylinder 44, the sealing cover 35 is separated from the mount table 23. When the rod 45 is inserted into the cylinder 44, the cover 35 covers and seals the mount table 23. In the state where the cover 35 covers the mount table 23, it is desirable that gap $L_1$ be 10 mm or less. It is most desirable that gap $L_1$ be in the range of 3 to 5 mm.

A solvent supply (not shown) communicates with a solvent-introducing port 40 by way of a valve 42 and solvent supply hose 43. The solvent-introducing port 40 communicates with an annular groove 41, and this annular groove is open in the peripheral portion of the upper face of the mount table 23. The diameter of the annular groove 41 is greater than that of a wafer. The solvent supply contains a solvent such as thinner or water.

Figure 3:
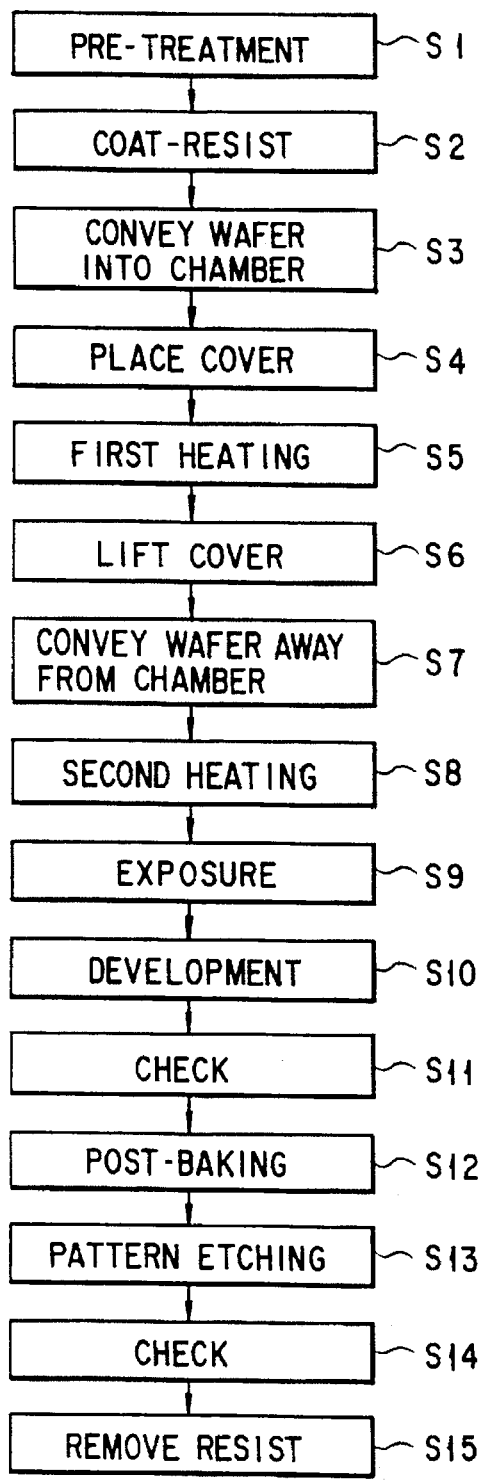
FIG. 3 is a flowchart showing the film treatment method used in the first embodiment.

The film treatment method according to the first embodiment will be described with reference to FIGS. 3 and 4.

A cassette containing a large number of wafers W is placed into the loader section 2 (i.e., the cassette station), and the wafer W is taken out from the cassette one by one and placed in the first process section 15 by means of the arm mechanism 3. The wafer W is first subjected to brush cleaning in the process chamber 6, then subjected to jet cleaning and spin-drying in the process chamber 7, and then subjected to adhesion treatment in the process chamber 8 (Step S1). After cooled in the process chamber 9, the wafer W is placed in the process chamber 12 where a resist solution is spin-coated on the surface of the wafer W (step S2).

After the spin coating, the wafer W is transferred from the first process section 15 to the second process section 17 (Step S3). The time required for transferring the wafer W from the first process section 15 to the second process section 17 should be as short as possible, since the wafer W must be placed in the process chamber 10 before the resist solution coated on the wafer W dries.

In the process chamber 10, a wafer W is first supported by means of the three support pins 31, and is then made to contact the upper face of the mount table 23 by retreating the pins 31 into the through holes 30 formed in the mount table 23. Simultaneously, the rod 45 is retreated into the cylinder 44, to thereby permit the mount table 23 to be covered with the sealing cover 35 (Step S4). Thus, the wafer W is set within the space between the mount table 23 and the cover 35. It should be noted that the volume of the space is small.

In the first heating step, the wafer W is heated at a low temperature by supplying power to the heater elements 25a and 26a (Step S5). The optimal conditions for this first heating step are a heating temperature of approximately 50° C. and a heating time of about 20 seconds. Although the heating temperature and the heating time are dependent on the ambient temperature and humidity, it is desirable that the former be in the range of 30° C. to 60° C. and the latter be in the range of 40 to 110 seconds. In the first heating step S5, the heating temperature of the outer hot plate 26 may be slightly higher than that of the inner hot plate 25 since the resist film coated on the wafer W has greater stress in the peripheral portions of the wafer W than in the central portions thereof, as described above.

Since, in the first heating step S5, the wafer W is placed in the atmosphere of the saturated vapor or the supersaturated vapor of solvent, the resist film is softened, and its viscosity lowers. It should be noted in particular that the wafer W is heated in the sealed space of small volume. Therefore, the evaporation of the solvent contained in the resist film is suppressed, and the resist film has a high degree of fluidity without being dried or hardened. Accordingly, the resist film is softened and flows such that its internal stress decreases. As a result, the thickness difference of the resist film decreases.

In the present embodiment, solvent vapor is supplied into the sealed space from the annular groove 41. However, the solvent vapor supply means 40–42 need not be provided in the case where the volume of the sealed space is very small. In other words, the volume of the sealed space can be increased to a certain extent in the case where the solvent vapor supply means 40–42 are provided.

After the end of the first heating step S5, the rod 45 is made to protrude from the cylinder 44, thereby lifting the cover 35 away from the mount table 23 (Step S6). Subsequently, the support pins 31 are raised to separate the wafer W from the mount table 23, and the wafer W is taken out from the process chamber 10 by means of the arm mechanism 3 (Step S7).

The wafer W is placed in the next process chamber 11. In this chamber 11, the wafer W is pre-baked, with the gas in the process chamber being exhausted (Step S8). The optimal conditions for this second heating step S8 are a heating temperature of approximately 90° C. and a heating time of about 90 seconds. It is desirable that the heating temperature in the second heating step S8 be in the range of 80° C. to 110° C. and the heating time thereof be in the range of 60 to 120 seconds. As a result of this pre-baking process, the resist film coated on the surface of the wafer W is dried and hardened. It should be noted that there is not particular limitation to the length of time between the end of the first heating step S5 and the start of the second heating step S8.

Thereafter, the wafer W placed in the exposure device (not shown), and the resist film on the wafer W is exposed to light (Step S9). Subsequently, the resist film is developed in the development chambers 14 (Step S10), and is then checked (Step S11). Further, the wafer W is subjected to hard-baking in the process chamber 11 (post-baking step S12). After the hard-baking step, pattern etching is performed (Step S13), a check is made (Step S14), and finally the resist is removed from the wafer (Step S15).

The thickness variations of resist films will be described with reference to FIGS. 5–7.

Figure 6:
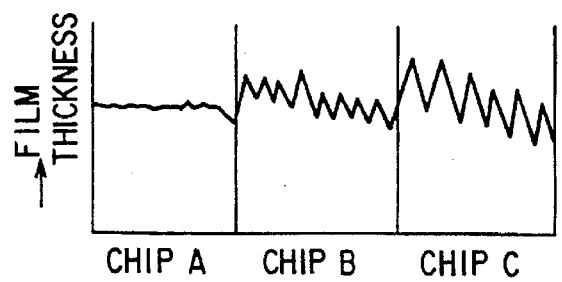
FIG. 6 is a graph showing the thickness variations of a resist film formed in the conventional film treatment method.

FIG. 6 is a graph showing how a resist film treated in the conventional method varies in thickness (control), the thickness variations being measured with respect to chips A, B and C. FIG. 7 is a graph showing how a resist film treated in the method of the present invention varies in thickness (example of the present invention), the thickness variations being measured with respect to chips A, B and C. In the control, pre-baking (i.e., the second heating step) is executed after the resist coating. As is shown in FIG. 5, chip A is located in the center of the wafer W, chip C is located in a peripheral portion of the wafer W, and chip B is located between chip A and chip C. As is apparent from FIGS. 6 and 7, the thickness variations of the resist film formed on chips B and C are noticeable in the control, whereas they are substantially uniform in the example. This is because the internal stress in the resist film is reduced by the first heating step S5 executed in the embodiment of the present invention.

Figure 8:
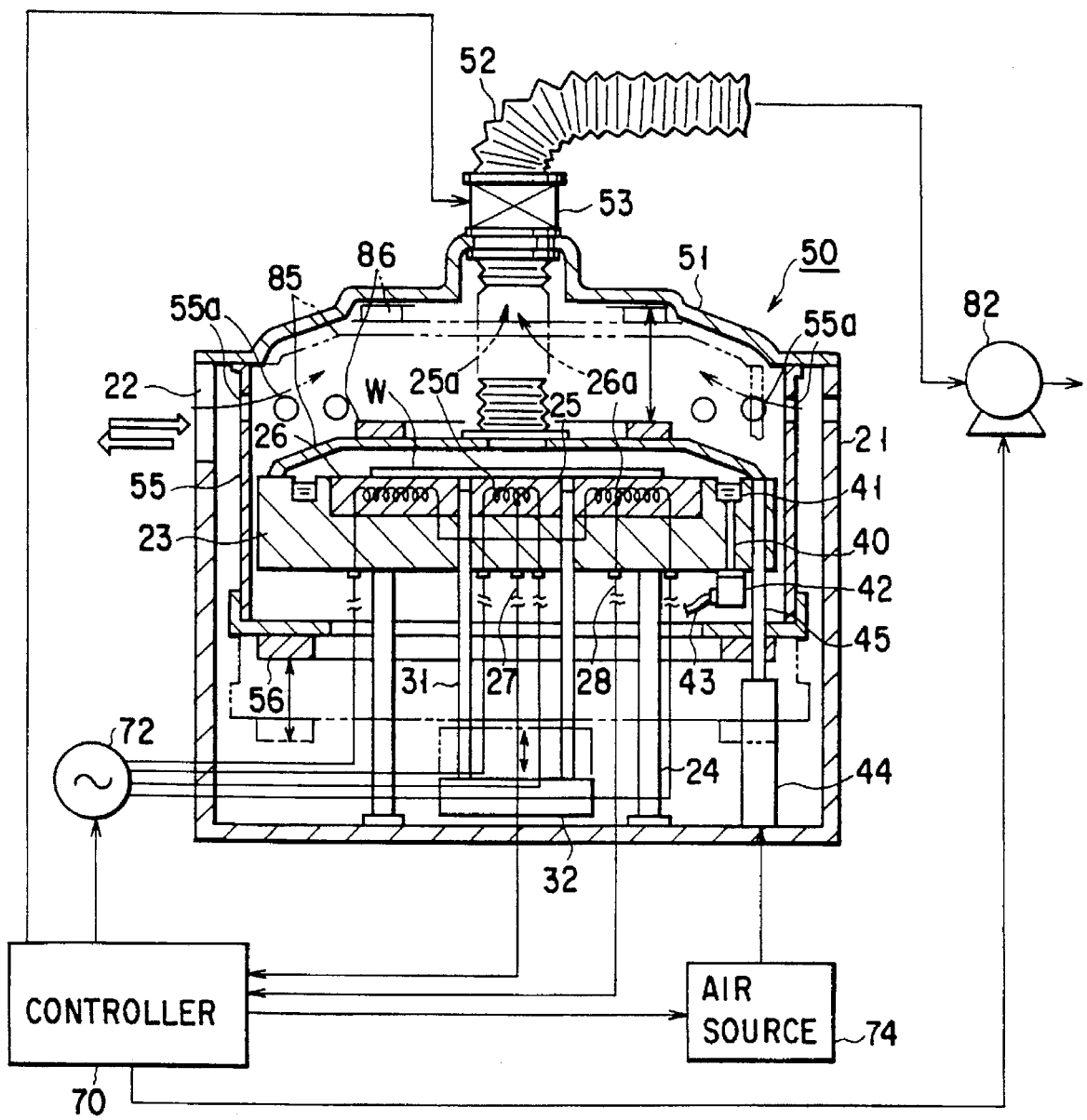
FIG. 8 is a sectional view showing a film treatment apparatus according to the second embodiment of the present invention.

A film treatment apparatus 50 according to the second embodiment will now be described with reference to FIG. 8. The second embodiment includes features which are similar to those of the first embodiment, and explanation of such features will be omitted herein, for the sake of simplicity.

In the second embodiment, the film treatment apparatus 50 is designed such that it can execute both the first heating step (low-temperature heating) and the second heating step (pre-baking). To be more specific, the film treatment apparatus 50 additionally comprises exhaust means 52, 53, 70 and 82.

An annular shutter member 55 is provided in such a manner as to surround a mount table 34 located inside the frame 21. The shutter member 55 is vertically movable by means of a third lifting mechanism 56. The third lifting mechanism 56 comprises a ball screw mechanism and a driving motor (neither is shown). A plurality of air holes 55a are formed in the peripheral portions of the shutter member 55, and clean air can flow into the interior of the apparatus 50 through the air holes 55a.

A flexible duct 52, which is in the form of bellows and constitutes part of the exhaust means, extends from the center of a sealing cover 85, penetrates a lid 51, and is connected to an air exhausting device 82. A damper 53 is arranged at an intermediate position of the flexible duct 52. The air exhausting device 82 and the damper 53 are controlled by a controller 70.

Figure 9:
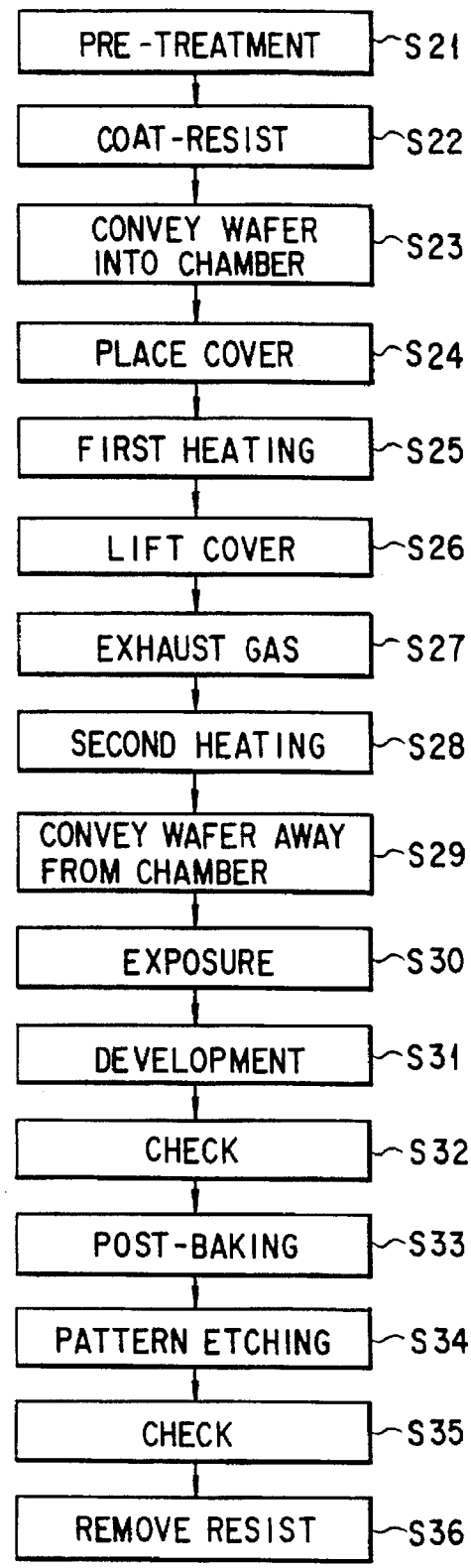
FIG. 9 is a flowchart showing the film treatment method used in the second embodiment.

The film treatment method according to the second embodiment will be described with reference to FIG. 9.

In the steps of the second embodiment, steps S21–S22 are substantially similar to steps S1–S2 of the first embodiment, and steps S30–S36 are substantially similar to steps S9–S15 of the first embodiment. In step S23 of the second embodiment, the shutter member 55 is lowered by means of the third lifting mechanism 56, and the sealing cover 85 is raised by means of the second lifting mechanism 44, 45, 74. In this state, a wafer W is placed in the process chamber 50 (Step A23).

In the process chamber 50, a wafer W is first supported by means of the three support pins 31, and is then is made to contact the upper face of the mount table 23 by retreating the pins 31 into the through-holes formed in the mount table 23. Simultaneously, the rod 45 is retreated into the cylinder 44, to thereby permit the mount table 23 to be covered with the sealing cover 35 (Step S24). In this state, the wafer W is heated at a low temperature by supplying power to the heater elements 25a and 26a (Step S25). The optimal conditions for this first heating step S25 are similar to those of the first embodiment.

After the end of the first heating step S25, the rod 45 is made to protrude from the cylinder 44, thereby lifting the cover 85 until it contacts the lid 51 (Step S26). Further, the shutter member 55 is lifted by the third lifting mechanism 56 until the upper end of the shutter member 55 contacts the lid 51. Then, the damper 53 is opened, and the air exhausting device 82 is driven to exhaust the gas from the chamber 50 (Step S27). The wafer W is pre-baked by supplying power to the heater elements 25a and 26a (Step S28). The optimal conditions for this second heating step S8 are similar to those of the first embodiment. After this second heating step S28, the support pins 31 are raised to separate the wafer W from the mount table 23, and the wafer W is taken out from the process chamber 50 by means of the arm mechanism 3 (Step S29).

According to the second embodiment mentioned above, both the first and second heating steps S25 and S28 can be executed in the same chamber 50. Therefore, the throughput can be improved.

In the embodiments mentioned above, the first heating step is executed, with the obverse side of the wafer W directed upward. Needless to say, the first heating step may be executed, with the reverse side of the wafer W directed upward.

In the above embodiments, the hot plates 25 and 26 containing heater elements 25a and 26a are employed as the heat source for the low-temperature heating and the high-temperature heating (pre-baking). However, the heat source employed in the present invention is not limited to the hot plate type. An oven type, an infrared heating type, or a microwave heating type may be employed in place of the hot plate type.

The present invention was described, referring to the case where the resist film coated on the semiconductor wafer W was treated. Needless to say, however, the present invention is applicable to the treatment of the resist film coated on an LCD substrate and to the heat treatment of various kinds of films formed on a wafer-like object by spin coating.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A film treating method for treating a resist film which is formed on a substrate by spin coating, comprising:
   a step of coating a resist composition containing a solvent on the substrate to form the resist film;
   a step of mounting the substrate coated with the resist film on a mount table;
   a step of covering the substrate coated with the resist film with a cover so as to define a sealed small-volume space, whereby an atmosphere of a saturated vapor or a super-saturated vapor of the solvent is formed in said sealed small-volume space before solvent included in the resist film is lost;
   a step of executing a first heating process in said sealed space wherein the substrate coated with the resist film is heated at a temperature which lowers the viscosity of the resist film and permits solvent to remain in the resist film in an amount sufficient to maintain the fluidity of the resist film;
   a step of removing the cover so as to change said sealed small-volume space to a non-sealed space surrounding the substrate coated with the resist film; and
   a step of executing a second heating process in said non-sealed space wherein the substrate coated with the resist film is heated at a temperature higher than that of the first heating process, thereby permitting the solvent to evaporate from the resist film.

2. A film treating method according to claim 1, wherein the substrate and the cover are kept away from each other by a distance of 10 mm or less when the substrate is overlaid with the cover.

3. A film treating method according to claim 1, wherein, in said first heating process, solvent vapor is supplied to the sealed small-volume space surrounding the substrate coated with the resist film, whereby the solvent of the resist film is prevented from evaporating when the substrate is heated.

4. A film treating method according to claim 1, wherein, in said first heating process, the substrate coated with the resist film is placed on the mount table with the mount table including heater means and means for controlling said heater means.

5. A film treating method according to claim 1, wherein said first heating process is executed before the resist film dries.

6. A film treating method according to claim 1, wherein said substrate coated with the resist film is heated at a temperature between 30° C. and 60° C. in the first heating process.

7. A film treating method according to claim 1, wherein said substrate coated with the resist film is heated for 20 seconds or longer in said first heating process.

8. A film treating method according to claim 1, wherein said substrate coated with the resist film is heated for 40 to 100 seconds in the first heating process.

9. A film treating method according to claim 1, wherein, in said first heating process, the substrate coated with the resist film is heated such that peripheral portions of the substrate coated with the resist film have a higher temperature than that of central portions thereof.

10. A film treating method according to claim 1, wherein, in said second heating process, the substrate coated with the resist film is heated at a temperature between 80° C. to 100° C. in a gas exhausting environment.

11. A film treating method according to claim 1, wherein, in said second heating process, the substrate coated with the resist film is heated at a temperature between 60° C. to 120° C. in a gas exhausting environment.

12. A film treating method according to claim 1, wherein said first and second heating processes are executed in first and second containers, respectively, and said second heating process is executed, with a gas in the second container being exhausted.

13. A film treating method according to claim 1, wherein said first and second heating processes are executed in a single container, said first heating process being executed with said single container being sealed, and said second heating process being executed with a gas in said single container being exhausted.

* * * * *